(12) United States Patent
Sheng

(10) Patent No.: US 8,407,648 B2
(45) Date of Patent: Mar. 26, 2013

(54) PRINTED CIRCUIT BOARD LAYOUT DEVICE CAPABLE OF AUTOMATICALLY ARRANGING ENCAPSULATED COMPONENT AND METHOD THEREOF

(75) Inventor: Xiao-Cheng Sheng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 119 days.

(21) Appl. No.: 13/095,861

(22) Filed: Apr. 28, 2011

(65) Prior Publication Data

US 2012/0216170 A1    Aug. 23, 2012

(30) Foreign Application Priority Data

Jan. 24, 2011   (CN) .......................... 2011 1 0025410

(51) Int. Cl.
*G06F 17/50*   (2006.01)
(52) U.S. Cl. .................. 716/126; 716/101; 716/139
(58) Field of Classification Search .................. 716/101, 716/126, 139
See application file for complete search history.

(56) References Cited

U.S. PATENT DOCUMENTS 6,829,749 B2 *  12/2004  Osaka et al. .................. 716/102

* cited by examiner

*Primary Examiner* — Thuan Do
(74) *Attorney, Agent, or Firm* — Altis Law Group, Inc.

(57) ABSTRACT

A computer-implemented method for component arrangement in a PCB layout device is provided. The device includes wiring diagrams. First, generates a PCB encapsulation diagram corresponding to the selected wiring diagram. Then, obtains the coordinates of each electronic component in the selected wiring diagram. Next, generates a prompt to prompt the user to select a reference point in the PCB encapsulation diagram. Then, obtains the coordinates of the reference point. Next, determines an abscissa difference and an ordinate difference between one component in the wiring diagram and the reference point. Then, determines the coordinates of each encapsulated component in the PCB encapsulation diagram according to the abscissa difference, the ordinate difference, and the coordinates of each electronic component in the wiring diagram. And last, moves each encapsulated component to the determined corresponding coordinates of each encapsulated component in the PCB encapsulation diagram.

12 Claims, 5 Drawing Sheets

PRINTED CIRCUIT BOARD LAYOUT DEVICE CAPABLE OF AUTOMATICALLY ARRANGING ENCAPSULATED COMPONENT AND METHOD THEREOF

BACKGROUND

1. Technical Field

The present disclosure relates to printed circuit board layout field and, particularly, to a printed circuit board layout (PCB) device capable of automatically arranging encapsulated components and method thereof.

2. Description of Related Art

Allegro is a known software for printed circuit board (PCB) layout. Using Allegro, a wiring diagram is first drawn, and then a PCB encapsulation diagram is generated according to the wiring diagram. The wiring diagram includes a number of electronic components showing component symbols. The PCB encapsulation diagram includes a number of encapsulated components corresponding to the electronic components. The encapsulated components are usually disorderly arranged when the PCB encapsulation diagram is generated, and designers need to manually move the encapsulated components one by one according to the arrangement of the electronic components of the wiring diagram, which is time consuming and troublesome.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Embodiments of the present disclosure are now described in detail, with reference to the accompanying drawings.

In general, the word "module," as used herein, refers to logic embodied in hardware or firmware, or to a collection of software instructions, written in a programming language, for example, Java, C, or Assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage system.

Figure 1:
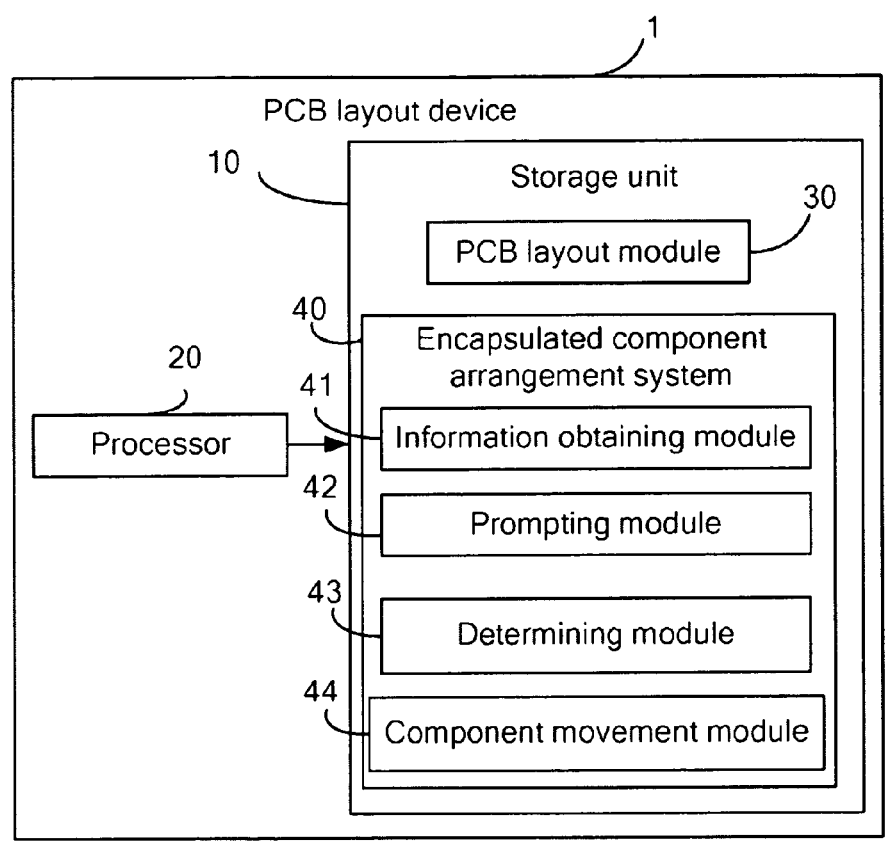
FIG. 1 is a block diagram of a PCB layout device in accordance with an exemplary embodiment.

FIG. 1 is a block diagram of a PCB layout device 1 in accordance with an exemplary embodiment. The PCB layout device 1 includes a storage system 10, a processor 20, a PCB layout system 30, and an encapsulated component arrangement system 40. The storage system 10 stores a number of wiring diagrams (see FIG. 2). Each wiring diagram includes a number of electrical components. Each electronic component corresponds to one set of coordinates in the wiring diagram. The processor 20 is to execute one or more computerized codes of the PCB layout device 1 and other applications, to provide the function of the PCB layout device 1.

The PCB layout system 30 is to generate a PCB encapsulation diagram (see FIG. 3) corresponding to a selected wiring diagram in response to designer's operation. The PCB encapsulation diagram includes a number of encapsulated components corresponding to the electronic components. Each encapsulated component corresponds to one set of coordinates in the PCB encapsulation diagram.

The encapsulated component arrangement system 40 includes an information obtaining module 41, a prompting module 42, a determining module 43, and a component movement module 44. The PCB layout system 30 and modules 41-44 may include computerized code in the form of one or more programs that are stored in the storage system 10. The computerized code includes instructions that are executed by the at least one processor 20 to provide functions for modules 41-44. Details of these operations follow.

The information obtaining module 41 is to obtain electronic component information of the selected wiring diagram. For example, in the embodiment, the electronic component information is the set of coordinates of each electronic component in the wiring diagram.

The prompting module 42 is to generate a prompt to prompt the designer to select a reference point in the PCB encapsulation diagram.

The determining module 43 is to obtain the set of coordinates of the selected reference point. The determining module 43 further determines the abscissa difference and the ordinate difference between one electronic component in the wiring diagram and the selected reference point in PCB encapsulation diagram according to the set of coordinates of the one electronic component and the selected reference point. For example, the determining module 43 determines that the abscissa difference is equal to the value of the abscissa of the one electronic component subtracting the value of the abscissa of the selected reference point, and the ordinate difference is equal to the value of the ordinate of the one electronic component subtracting the ordinate of the reference point. In the embodiment, the one electronic component can be the electronic component whose electronic component information is first obtained by the information obtaining module 41 or any electronic component in the wiring diagram.

The determining module 43 further determines the set of coordinates of each encapsulated component in the PCB encapsulation diagram according to the abscissa difference, the ordinate difference, and the set of coordinates of each electronic component in the wiring diagram. In the embodiment, the horizontal direction of the PCB encapsulation diagram is the same as that of the wiring diagram, and the vertical direction of the PCB encapsulated component is opposite to that of the wiring diagram. Therefore, the determining module 43 determines that the abscissa of each encapsulated components is the value of the abscissa of the corresponding electronic component subtracting the abscissa difference, and the ordinate of each encapsulated components is the value of the ordinate of the corresponding electronic component adding the ordinate difference.

Figure 4:
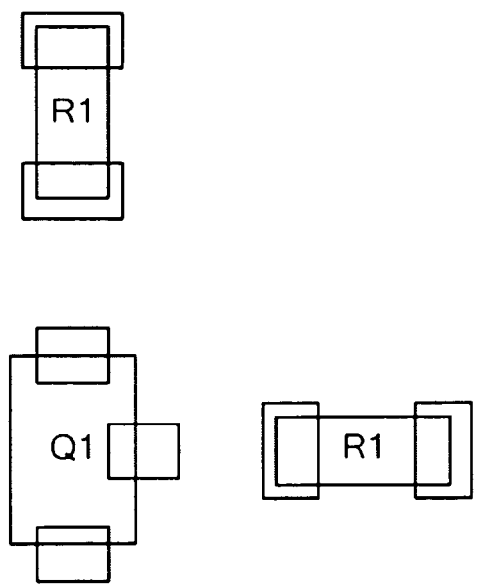
FIG. 4 is a schematic view showing that encapsulated components of the PCB encapsulation diagram is adjusted to coincide with the arrangement of electronic components of the wiring diagram of FIG. 2.

The component movement module 44 moves each encapsulated component to a corresponding determined set of coordinates of each of the encapsulated components in the PCB encapsulation diagram (see FIG. 4). In this embodiment, the information obtaining module 41 further obtains a symbol of each electronic component, obtains a shape of each encapsulated component according to the obtained symbol of each electronic component, and determines the centre of each encapsulated component according to the obtained shape of each encapsulated component. The component movement module 44 moves the centre of each encapsulated component to the determined set of coordinates of each encapsulated component, thereby, the encapsulated component is regarded as being disposed in an appropriate position. In an alternative embodiment, the component movement module 44 moves any point of each encapsulated component to the determined set of coordinates of each encapsulated component, thereby, the encapsulated component is regarded as being disposed in an appropriate position.

Figure 2:
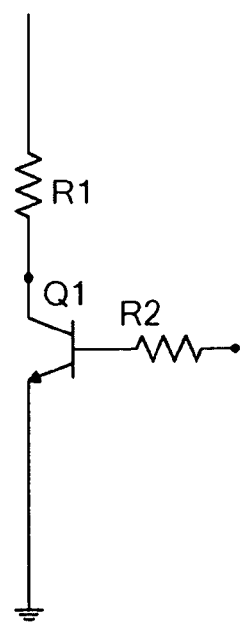
FIG. 2 is a circuit diagram of a wiring diagram in accordance with an exemplary embodiment.
Figure 3:
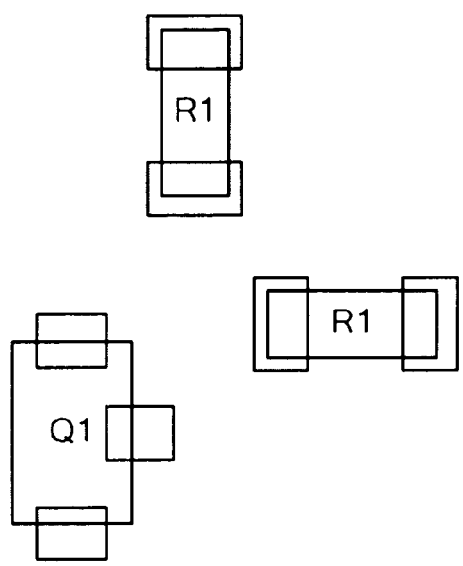
FIG. 3 is a schematic view of a PCB encapsulation diagram corresponding to the wiring diagram of FIG. 2.

In this embodiment, the print circuit board layout device 1 can automatically arrange each encapsulated component of the PCB encapsulation diagram, thus the relative position of the encapsulated components in the PCB encapsulated package diagram is the same as that of the electronic components in the wiring diagram (see FIGS. 2-4).

Figure 5:
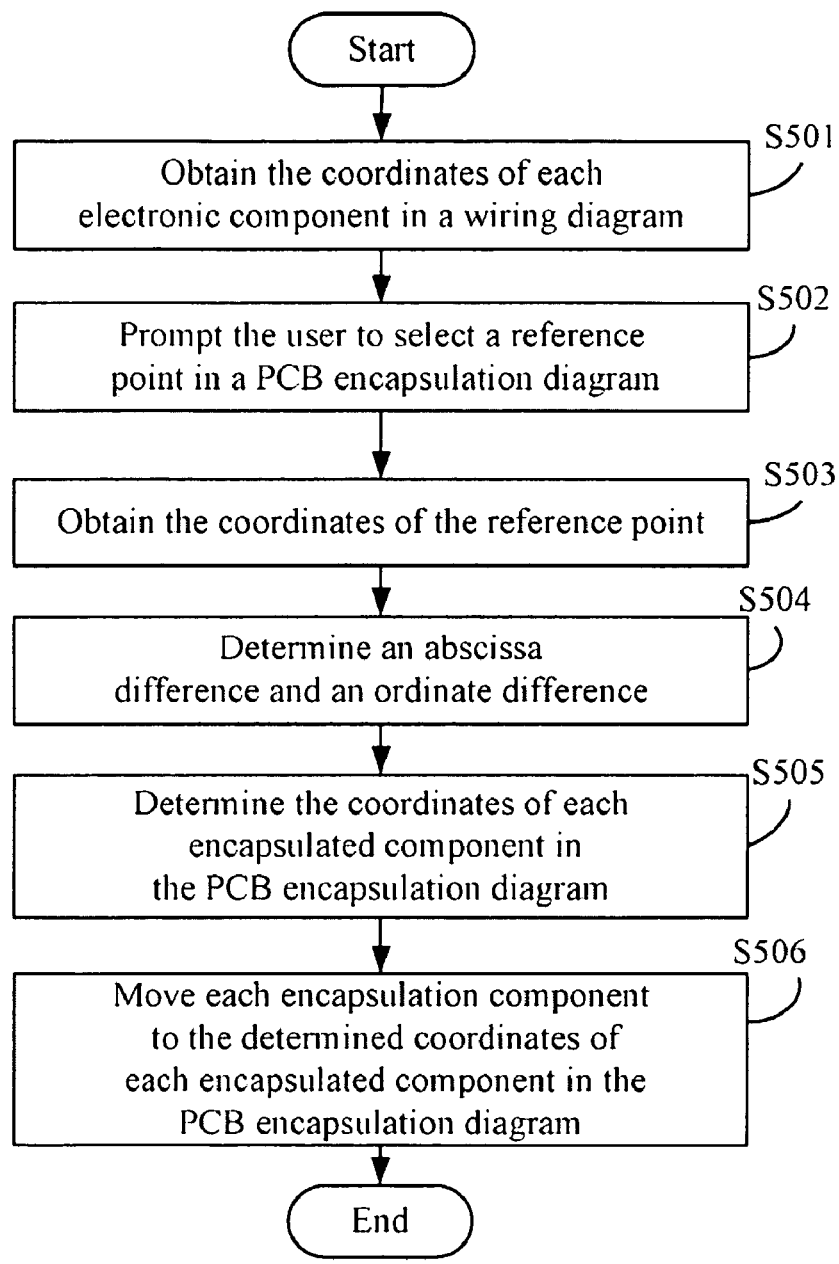
FIG. 5 is a flowchart of a method for arranging encapsulated components in a PCB layout device in accordance with an exemplary embodiment.

Referring to FIG. 5, a method for arranging encapsulated components in accordance with an embodiment is shown.

In step S501, the information obtaining module 41 obtains the electronic component information of the selected wiring diagram. In the embodiment, the component information is the set of coordinates of each electronic component.

In step S502, the prompting module 42 generates a prompt to prompt the user to select a reference point in the PCB encapsulation diagram.

In step S503, the determining module 43 obtains the set of coordinates of the selected reference point.

In step S504, the determining module 43 determines an abscissa difference and an ordinate difference between one electronic component in the wiring diagram and the selected reference point according to the set of coordinates of one electronic component and the selected reference point. For example, the determining module 43 determines that the abscissa difference is equal to the value of the abscissa of one electronic component in the wiring diagram subtracting the abscissa of the selected reference point, and the ordinate difference is equal to the value of the ordinate of one electronic component in the wiring diagram subtracting the ordinate of the selected reference point.

In step S505, the determining module 43 determines the set of coordinates of each encapsulated component in the PCB encapsulation diagram according to the abscissa difference, the ordinate difference, and the set of coordinates of each electronic component in the wiring diagram. The determining module 43 determines that the abscissa of each encapsulated component is the value of the abscissa of the corresponding electronic component in the wiring diagram subtracting the abscissa difference, and determines that the ordinates of each encapsulated component is the value of the ordinates of the corresponding electronic component in the wiring diagram adding the ordinate difference.

In step S506, the component movement module 44 moves each encapsulated component to a corresponding determined set of coordinates of each of the encapsulated components in the PCB encapsulation diagram. In this embodiment, the information obtaining module 41 obtains a symbol of each electronic component, obtains a shape of each encapsulated component in the PCB encapsulation diagram according to the obtained symbol of each electronic component, and obtains the centre of each encapsulated component of the PCB encapsulation diagram according to the obtained shape of each encapsulated component. The component movement module 44 moves the centre of each encapsulated component to the corresponding determined set of coordinates of each encapsulated component in the PCB encapsulation diagram. In an alternative embodiment, the component movement module 44 moves any point of each encapsulated component to the corresponding determined set of coordinates of each encapsulated component in the PCB encapsulation diagram.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:
1. A PCB layout device, comprising:
a storage system to store a plurality of wiring diagrams, each wiring diagram comprising a plurality of electronic components, each of the electronic components corresponding to one set of coordinates in the wiring diagram;
a processor;
one or more programs stored in the storage system, executable by the processor, the one or more programs comprising:
  a PCB layout system to generate a PCB encapsulation diagram corresponding to the selected wiring diagram, the PCB encapsulation diagram comprising a plurality of encapsulated components corresponding to the electrical components, each of the encapsulated components corresponding to one of the sets of coordinates; and
  an encapsulated component arrangement system comprising:
    an information obtaining module to obtain the set of coordinates of each of the electronic components of the selected wiring diagram;
    a prompting module to generate a prompt to prompt the designer to select a reference point in the PCB encapsulation diagram;
    a determining module to obtain the set of coordinates of the selected reference point, determining an abscissa difference and an ordinate difference between one electronic component in the wiring diagram and the selected reference point according to the set of coordinates of one of the electronic components and the selected reference point, and determines the set of coordinates of each of the encapsulated components in the PCB encapsulation diagram according to the abscissa difference, the ordinate difference, and the set of coordinates of each of the electronic components in the wiring diagram; and
    a component movement module to move each of the encapsulated components to the corresponding determined set of coordinates of each of the encapsulated components in the PCB encapsulation diagram;
  wherein the determining module determines that the abscissa difference is equal to the value of the abscissa of one of the electronic components in the wiring diagram subtracting the abscissa of the reference point, and determines that the ordinate difference is equal to the value of the ordinate of one of the electronic components in the wiring diagram subtracting the ordinate of the reference point.

2. The PCB layout device as described in claim 1, wherein the determining module determines that the abscissa of each of the encapsulated components is the value of the abscissa of each of the corresponding electronic components in the wiring diagram subtracting the abscissa difference, and the ordinate of each of the encapsulated components is the value of the ordinate of each of the corresponding electronic component in the wiring diagram adding the ordinate difference.

3. The PCB layout device as described in claim 1, wherein the one electronic component is the electronic component whose electronic component information is the firstly obtained by the information obtaining module.

4. The PCB layout device as described in claim 1, wherein the one electronic component is any one electronic component in the wiring diagram.

5. A computer-implemented method for arranging encapsulated component in a PCB layout device, the PCB layout device comprising a plurality of wiring diagrams and a processor, each of the wiring diagram comprising a plurality of electronic components, each of the electronic components corresponding to one of the sets of coordinates, the method comprising:

generating an PCB encapsulation diagram corresponding to the selected wiring diagram via the processor, the PCB encapsulation diagram comprising a plurality of encapsulated components, each of the encapsulated components corresponding to one of the sets of coordinates;

obtaining the set of coordinates of each of the electronic components in the selected wiring diagram via the processor;

generating a prompt to prompt the user to select a reference point in the PCB encapsulation diagram via the processor;

obtaining the set of coordinates of the selected reference point via the processor;

determining an abscissa difference and an ordinate difference between one of the electronic component in the wiring diagram and the selected reference point according to the set of coordinates of one of the electronic component and the selected reference point via the processor;

determining the set of coordinates of each of the encapsulated components in the PCB encapsulation diagram according to the abscissa difference, the ordinate difference, and the set of coordinates of each of the electronic components in the wiring diagram via the processor; and moving each of the encapsulated components to the determined corresponding set of coordinates of each of the encapsulated components in the PCB encapsulation diagram via the processor;

wherein the step "determine an abscissa difference and an ordinate difference" in detail comprises:

determining that the abscissa difference is the value of the abscissa of one electronic component in the wiring diagram subtracting the abscissa of the reference point via the processor; and determining that the ordinate difference is the value of the ordinate of one electronic component in the wiring diagram subtracting the ordinate of the reference point via the processor.

6. The method as described in claim 5, wherein the step "determining the set of coordinates of each of the encapsulated components" in detail comprises:

determining the abscissa of each of the encapsulated components is the value of the abscissa of each of the electronic components in the wiring diagram subtracting the abscissa difference via the processor; and determining the ordinate of each of the encapsulated components is the ordinate of each of the electronic components in the wiring diagram adding the ordinate difference via the processor.

7. The method as described in claim 5, wherein the step "moving each of the encapsulated components to the determined corresponding set of coordinates of each of the encapsulated components" in detail comprises:

obtaining a symbol of each of the electronic components in the wiring diagram via the processor;

obtaining a shape of each of the encapsulated components in the PCB encapsulation diagram according to the obtained symbol of each of the electronic components via the processor;

obtaining the centre of each of the encapsulated components according to the obtained shape of each of the encapsulated components via the processor; and moving the centre of each of the encapsulated components to the determined corresponding set of coordinates of each of the encapsulated components via the processor.

8. The method as described in claim 5, wherein the step "moving each of the encapsulated components to the determined corresponding set of coordinates of each of the encapsulated components" in detail comprises:

moving any point of each of the encapsulated components to the determined corresponding set of coordinates of each of the encapsulated components via the processor.

9. A storage system storing a set of instructions, the set of instructions capable of executed by a processor to perform a method for component arrangement in a PCB layout device, the PCB layout device comprising a plurality of wiring diagrams, each of the wiring diagrams comprising a plurality of electronic components, each of the electronic components corresponding to one of the sets of coordinates, the method comprising:

generating a PCB encapsulation diagram corresponding to the selected wiring diagram, the PCB encapsulation diagram comprising a plurality of encapsulated components, each of the encapsulated components corresponding to one of the sets of coordinates;

obtaining the set of coordinates of each of the electronic components in the selected wiring diagram;

generating a prompt to prompt the user to select a reference point in the PCB encapsulation diagram;

obtaining the set of coordinates of the selected reference point;

determining an abscissa difference and an ordinate difference between one of the electronic component in the wiring diagram and the selected reference point according to the set of coordinates of one of the electronic component and the selected reference point;

determining the set of coordinates of each of the encapsulated components in the PCB encapsulation diagram according to the abscissa difference, the ordinate difference, and the set of coordinates of each of the electronic components in the wiring diagram; and moving each of the encapsulated components to the determined corresponding set of coordinates of each of the encapsulated components in the PCB encapsulation diagram;

wherein the step "determine an abscissa difference and an ordinate difference" in detail comprises:

determining that the abscissa difference is the value of the abscissa of one electronic component in the wiring diagram subtracting the abscissa of the reference point; and determining that the ordinate difference is the value of the ordinate of one electronic component in the wiring diagram subtracting the ordinate of the reference point.

10. The method as described in claim 9, wherein the step "determining the set of coordinates of each of the encapsulated components" in detail comprises:
    determining the abscissa of each of the encapsulated components is the value of the abscissa of each of the electronic components in the wiring diagram subtracting the abscissa difference; and
    determining the ordinate of each of the encapsulated components is the ordinate of each of the electronic components in the wiring diagram adding the ordinate difference.

11. The method as described in claim 9, wherein the step "moving each of the encapsulated components to the determined corresponding set of coordinates of each of the encapsulated components" in detail comprises:
    obtaining the symbol of each of the electronic components in the wiring diagram;
    obtaining the shape of each of the encapsulated components in the PCB encapsulation diagram according to the obtained symbol of each of the electronic components;
    obtaining the centre of each of the encapsulated components according to the obtained shape of each of the encapsulated components; and
    moving the centre of each of the encapsulated components to the determined corresponding set of coordinates of each of the encapsulated components.

12. The method as described in claim 9, wherein the step "moving each of the encapsulated components to the determined corresponding set of coordinates of each of the encapsulated components" in detail comprises:
    moving any point of each of the encapsulated components to the determined corresponding set of coordinates of each of the encapsulated components.

* * * * *